United States Patent [19]

Neidich

[11] Patent Number: 4,889,496
[45] Date of Patent: Dec. 26, 1989

[54] COMPRESSIBLE CORE ELECTRICAL CONNECTOR

[75] Inventor: Douglas A. Neidich, Harrisburg, Pa.

[73] Assignee: InterCon Systems, Inc., Harrisburg, Pa.

[21] Appl. No.: 300,193

[22] Filed: Jan. 23, 1989

Related U.S. Application Data

[63] Continuation of Ser. No. 180,387, Apr. 12, 1988, abandoned.

[51] Int. Cl.$^4$ .......................... H01R 9/09; H01R 4/56
[52] U.S. Cl. ........................................ 439/75; 439/81; 439/245; 439/840; 439/889
[58] Field of Search ................ 439/75, 78, 80-82, 439/245, 840, 888, 889

[56] References Cited

U.S. PATENT DOCUMENTS

| | | |
|---|---|---|
| 1,334,040 | 3/1920 | Lee . |
| 2,972,125 | 2/1961 | Temple et al. .................... 339/61 |
| 3,022,369 | 2/1962 | Rayburn .................... 174/68.5 |
| 3,205,468 | 9/1965 | Henschen ....................... 439/81 |
| 3,255,430 | 6/1966 | Phillips ........................ 339/252 |
| 3,319,217 | 5/1967 | Phillips ........................ 339/175 |
| 3,371,249 | 2/1968 | Prohofsky ....................... 439/75 |
| 3,880,492 | 4/1975 | Shlesinger .................... 339/252 |
| 4,147,397 | 4/1979 | Iantorno ....................... 339/17 |
| 4,358,180 | 11/1982 | Lincoln ....................... 339/252 |
| 4,487,463 | 12/1984 | Tillotson ....................... 339/17 |
| 4,541,681 | 9/1985 | Dorman et al. ................ 339/100 |
| 4,556,265 | 12/1985 | Cunningham ................... 339/17 |

OTHER PUBLICATIONS

Control Data Corporation Drawing Nos. 21942500, 21942600, 21942700, 2/15/73.
Cray Research, Inc. Drawing Nos. C3-0025, 10/5/85; C3-0038, 10/18/85; C3-0039, 10/21/85; C3-0040, 10/21/85; C3-0043, 10/25/85.

Primary Examiner—P. Austin Bradley
Attorney, Agent, or Firm—Thomas Hooker

[57] ABSTRACT

A compressible core electrical connector for forming a connection within a circuit board hole includes a plurality of conductive spiral strands extending between the ends of the connector and defining spiral wound lead-in and trailing portions at the ends of the connector and a centrral contact portion including a compressible core with the spiral wound strands wrapped around the core.

28 Claims, 3 Drawing Sheets

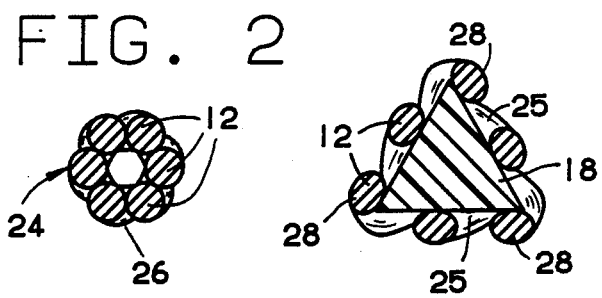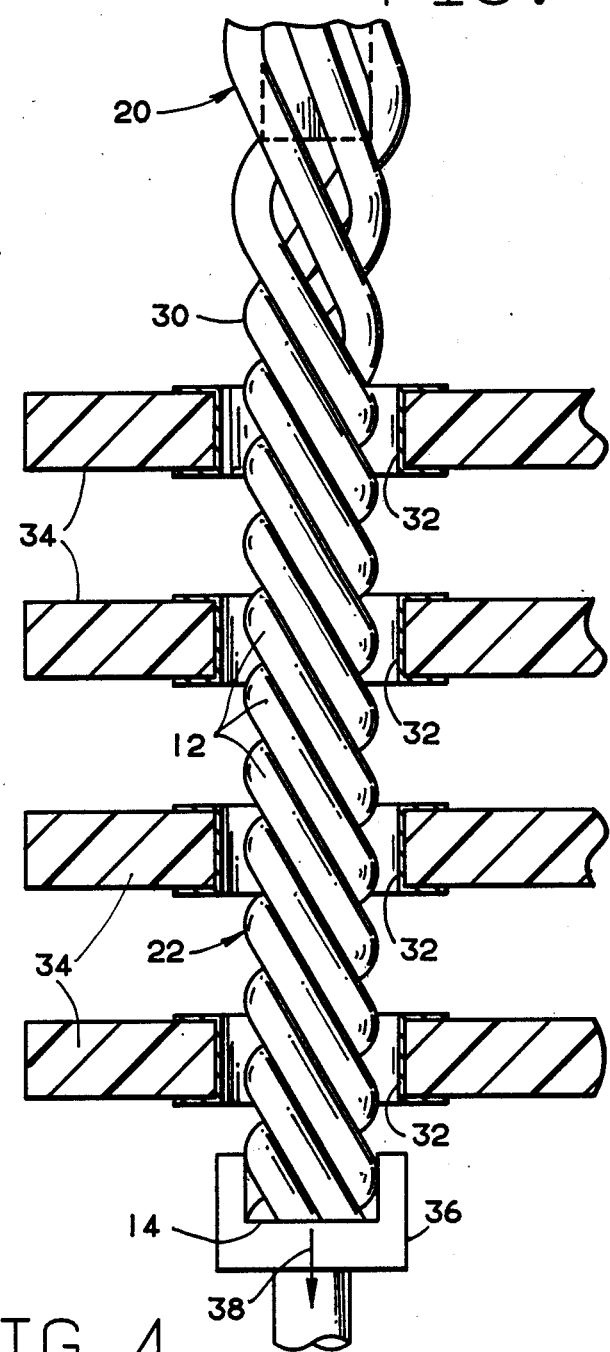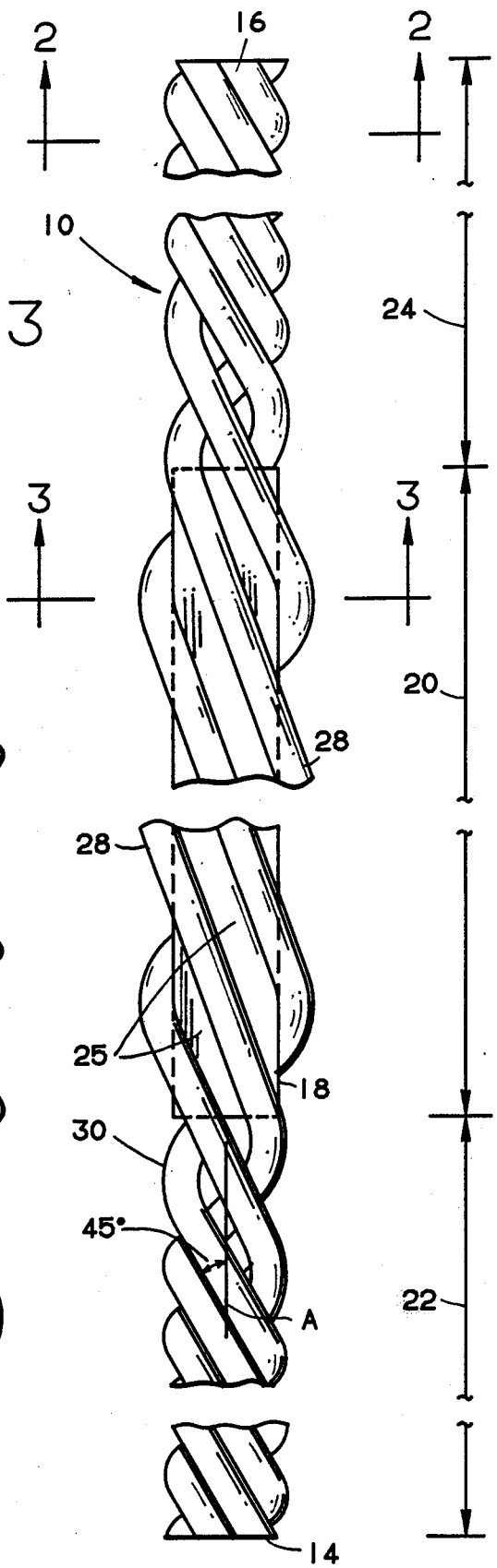

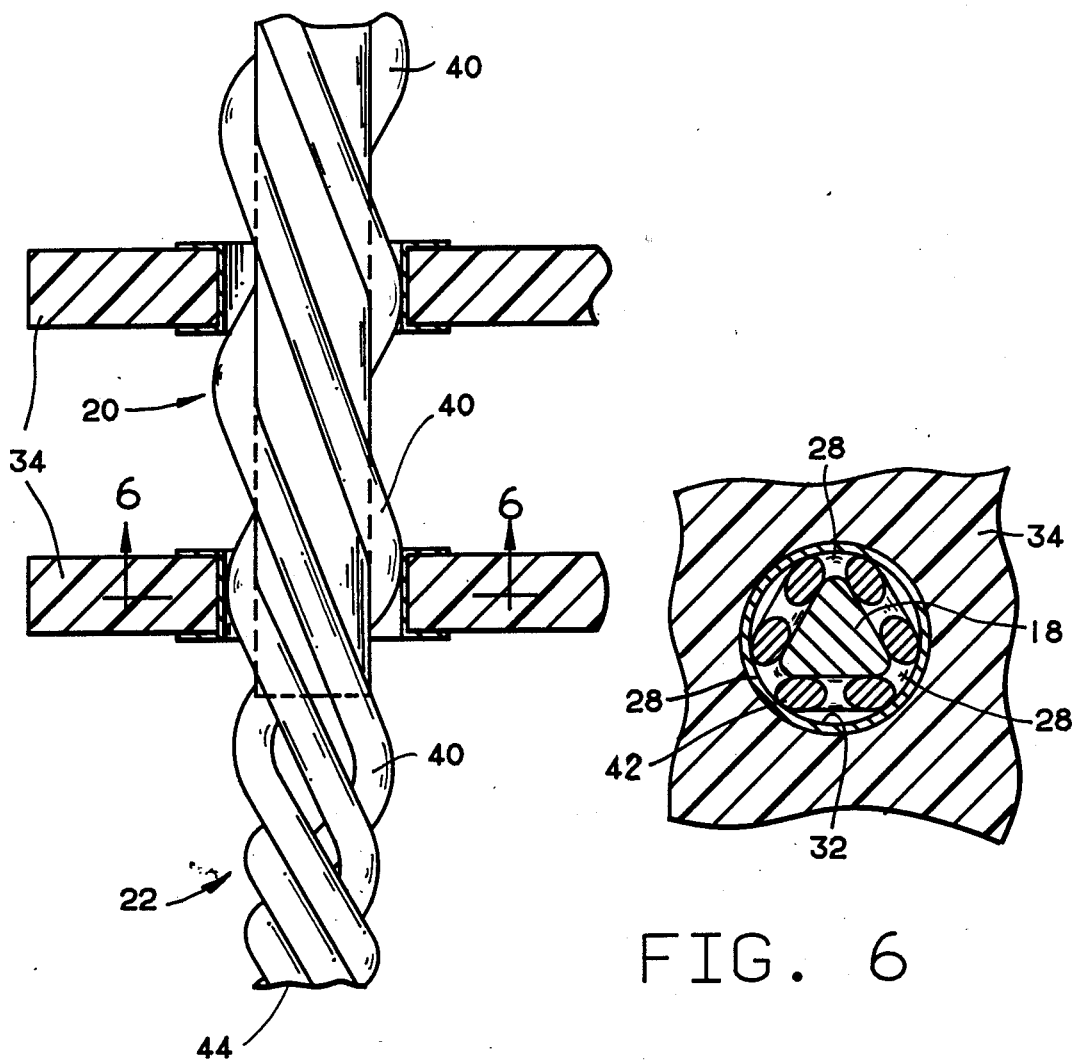
FIG. 5
FIG. 6
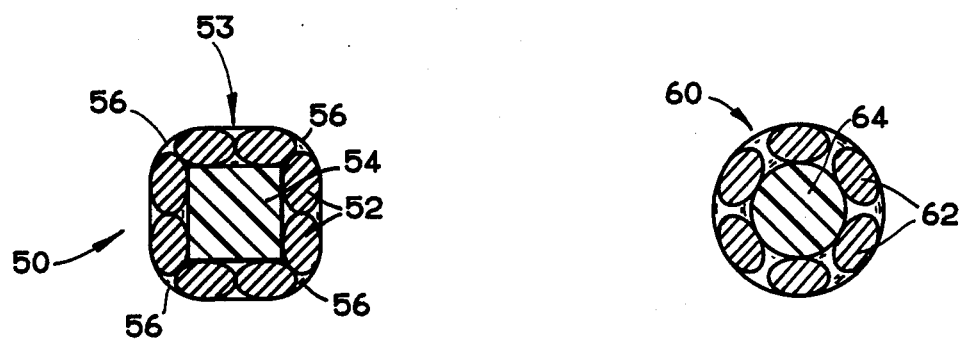
FIG. 7
FIG. 8

COMPRESSIBLE CORE ELECTRICAL CONNECTOR

This is a continuation of co-pending application Ser. No. 180,387, filed on Apr. 12, 1988 now abandoned.

This invention relates to electrical connectors and, particularly, to electrical connectors adapted to be inserted into circuit board holes for forming electrical connections with plating in the holes. The disclosed electrical connector may be used for forming an electrical connection between a number of stacked circuit boards.

Conventionally, connectors used for forming electrical connections in plated circuit board holes are stamped formed from a single metal piece and have one or more specialized one arms or springs which contact the circuit board hole. Insertion of the connector into the board deforms the arm or spring to provide a pressure connection with the plating in the hole. The deformation is frequently permanent.

This type of connector is relatively large and is becoming increasingly unsuited for use in modern high density circuitry. Insertion of the these connectors into the board deforms the connectors and, frequently, injures the delicate plating in the circuit board hole. Insertion forces are relatively large, making it difficult to insert connectors of this type through a multiple stack of circuit boards and establish reliable electrical connections with all the boards. Withdrawal of the connectors involves application of high forces and, frequently, cannot be done without injuring the connectors, the plating in the holes or the circuit boards into which they are inserted.

The present invention is a small diameter spiral wound compressible core connector particularly adapted for forming reliable and reusable electrical connections between closely spaced connector circuit boards with small diameter plated holes. Insertion and withdrawal of the connector does not injure the connector, plating in the circuit board hole or the board itself.

The connector includes a plurality of spiral wound conductive strands extending between the opposite ends of the connector with a compressible core confined between the strands at a medial contact portion. The strands at one end of the contact portion extend for a length approximately equal to the length of the contact portion thereby forming a spiral wound reduced-diameter lead-in portion of the connector which may be piloted from one side of a stack of circuit boards through plated holes in the boards to position the insertion end of the connector on the other side of the boards. A pulling tool then engages the end and pulls the contact portion through the holes so that the core is compressed and biases the surrounding strands radially outwardly to form electrical connections with the plating. After insertion, the lead-in portion may be severed from the remainder of the inserted connector. The tool may be used to pull inserted the connector from the stack without injury to the plating or connector.

The compressible core may have longitudinally extending corners or edges which project outwardly and bias the spiral wound strands wrapped around the core against the plating at a number of spaced contact corners extending along the contact portion. Alternatively, the core may be cylindrical and bias the entire length of the surrounding strands against the plating in the hole.

The connectors are formed from continuous spiral wound strands in an indefinite length chain including a number of joined contacts which can be severed apart from each other prior to insertion of the circuit board holes. This facilitates manufacturing, handling and shipment of the connectors.

A number of embodiments are disclosed including connectors with from three to eight strands and different types of compressible cores.

Other objects and features of the invention will become apparent as the description proceeds, especially when taken in conjunction with the accompanying drawings illustrating the invention, of which there are three sheets.

IN THE DRAWINGS

FIG. 1 is a side view, partially broken away and greatly enlarged, of a compressible core electrical connector according to the invention;

FIGS. 2 and 3 are sectional views taken, respectively, along lines 2—2 and 3—3 of FIG. 1;

FIG. 4 is a view illustrating piloting of the lead-in portion of the connector through circuit board holes formed in a stack of spaced circuit boards;

FIG. 5 is a view similar to the view of FIG. 4 showing the connector fully inserted in a pair of circuit boards;

FIG. 6 is a sectional view taken along line 6—6 of FIG. 5;

FIGS. 7, 8 and 9 are sectional views taken through the contact portions of electrical connectors similar to the electrical connector of FIGS. 1 through 5;

Figure 10:
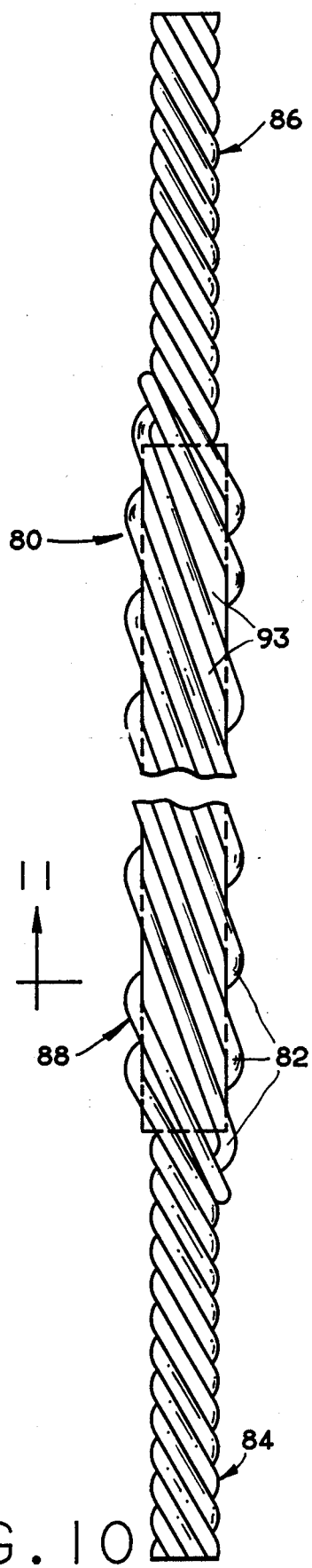
FIG. 10 is a view like FIG. 1 showing a different embodiment connector.

As shown in FIGS. 1, 2 and 3, compressible core electrical connector 10 is elongate and includes a plurality of spiral conductive strands 12 each extending between insertion end 14 of the connector and trailing end 16. A compressible plastic core 18, which may be formed of nylon plastic, extends along the length of a contact portion 20 located between ends 14 and 16 with the strands tightly spiral wound around the plastic core at the contact portion. The strands are tightly spiral wound around each other along the length of spiral lead-in portion 22 extending from one end of the contact portion 20 to insertion end 14 and trailing portion 24 extending from the other end of contact portion 22 to trailing end 16. As shown in FIG. 1, the contact portion has a larger transverse cross section than the lead in and trailing portions 22 and 24.

Connector 10 is formed using a wire wrapping process in which the strands are spiral wound by being fed together at a constant feed and withdrawn from the wrapping station at a fixed linear rate. Compressible cores 18 are placed between the strands at proper intervals to form an indefinite chain of spiral wound connectors. The connectors are severed at ends 14 and 16 prior to insertion into the boards. With a six strand connector 10, as illustrated, the strands in the contact and lead-in portions 20 and 22 are spiral wound at a 45 degree angle to the longitudinal axis "A" of the connector. See FIG. 1. As the wires are wrapped around the core 18 the diameter of the spiral wrap is increased and the wires separate from each other to form a spiral windows 25 extending along and slightly beyond the ends of the contact portion 20. At this portion the strands are angled away from axis "A" at an angle greater than 45 degrees. Spiral windows 25 extend around the portion at the same angle as the spiral strands of contact portion 20.

FIG. 2 is a cross sectional view taken through the trailing portion 24 and shows the six strands 12 tightly wound against each other to prevent unwinding. The strands surround a hollow, generally cylindrical central axial opening 26. The strands 12 are equally tightly spirally wound in lead in portion 22 as in portion 24 and have a similar central opening.

The compressible plastic core 18, as shown in FIG. 3, has a uniform triangular cross section with the strands 12 tightly spirally wrapped around the core so that the outer surface of the contact portion is generally triangular. Each strand is bent around the radially outwardly projecting corners of the core to form a plurality of contacts 28 spaced longitudinally along the corners of the core 18. At the end of the lead-in portion 22 adjacent contact portion 20 the diameter of the pin smoothly increases to the diameter of the contact portion to provide tapered transition portion 30.

The electrical connector 10 is particularly well adapted for forming electrical connections between closely stacked circuit boards or panels in a very densely constructed electronic environment. In one embodiment of pin 10 strands 12 are formed from beryllium copper with a gold plating and have a diameter of 0.00124 inch. The core is formed nylon plastic having a lateral cross section with each side 0.0042 inch wide. The contact portion 20 with six strands wound tightly around core 18 has an effective diameter of about 0.0066 inch. The "effective diameter" is the diameter of the circle superscribed around the contact corners 28. The diameter of the tightly spiral wound lead-in and trailing portions 22 and 24 is about 0.0045 inch.

Connector 10 may have a length of approximately 0.60 inch with a lead-in portion 22 of 0.30 inch, a contact portion 20 of 0.25 inch with a similar length core 18 and a trailing portion 24 0.05 inch long. The lead-in portion 22 is at least as long as the contact portion to permit free feeding or piloting of the lead-in portion through aligned plated contact holes 32 formed in a stack of parallel circuit boards 34 as shown in FIG. 4. The holes 32 may have a diameter of 0.0058 inch, less than the diameter of the lead-in portion 22 and greater than the diameter of the contact portion 20 of the connector prior to insertion in the holes.

Connector 10 is moved into holes 32 by piloting the lead-in end freely through the larger diameter holes as shown in FIG. 4 so that the insertion end 14 of the connector extends beyond the last board 34. Pulling tool 36 then engages the exposed insertion end of 14 and is moved axially away from the boards in the direction of arrow 38 to draw contact portion 20 into the plated holes 32. As the lead-in portion 22 is pulled downwardly, the tapered or transition portion 30 at the end of the lead-in portion adjacent the contact portion moves into hole 32 in the first circuit board 34 to guide the contact portion into the hole and compress the resilient core 18 thereby forcing the contact corners 28 outwardly into tight engagement with the conductive sides of the holes. The contact portion is elastically compressed in this manner as it passes through each hole 32 and then radially expands to form bulged portions 40 to either side of the holes having the same diameter as the contact portion 20 prior to insertion of the pin into the circuit board holes. As shown in FIG. 6, the compressible core 18 forces corners 28 against the plating 42 in the hole 32 to hold a number of the strands 12 at each corner 28 against the plating 32 and thereby form three sets of independent and redundant electrical connections between the connector and the plating at each circuit board hole.

When fully inserted, the contact portion 20 extends through all the stacked circuit board holes 32 with the core 18 elastically biasing the strands against each of the holes. The major part of the lead-in portion 22 may be severed from the confined contact portion. The trailing portion 44 extends above the uppermost board 44 essentially identically to the remaining end of the lead-in portion 22. In environments where there is little free space to either side of the stack of circuit boards it may be necessary to trim off all or nearly all of the connector projecting beyond the boards.

An inserted connector 10 with a remaining part of either portion 22 or 24 may be withdrawn from circuit board holes 32 by attaching a pulling tool 36 to the part and axially pulling the connector out from the holes. During withdrawal the contact portion is elastically deformed as it is moved through the holes and away from the board. The connector may be pulled out from the boards either in the direction of insertion or in a direction opposite the direction of insertion, depending upon which end is pulled.

During insertion and withdrawal of the connector the core 18 is deformed elastically without taking a set or permanent deformation. The core adjacent the lead-in portion moves through a number of circuit board holes 32 before it reaches its final or last hole 32 without deformation. This assures that the electrical connections formed at all holes 32 are all uniform and unimpaired by the movement core through the prior holes. The connection portion can be moved through any number of holes with an assurance that there is a redundant high pressure electrical connection formed between the strands and plating in each circuit board hole. Insertion and withdrawal of the connector into and from the circuit boards holes does not injure the plating in the holes. Accordingly, the connector may be inserted and withdrawn freely as required for servicing, testing, replacement of components, etc. as required without injury to the plating in the boards.

The compressible core 20 preferably has a very short deformation memory so that it returns to its original cross section following compression as portions of the core are moved through each hole 32. This permits close stacking of boards 34 with an assured reliable high pressure electrical connection formed between the connector and the plating in each hole.

FIG. 7 illustrates a second embodiment compressible core electrical connector 50 similar to connector 10 including eight spiral wound conductive and plated strands 52 extending between the ends of the connector. Connector 50 includes a central contact portion with lead-in and trailing portions to either side of the central contact portion like portions 22 and 24 of connector 10. The contact portion 53 of connector 50 differs from that of connector 10 by including a square, solid compressible plastic core 54 having four corners. The strands 52 are wrapped around the corners to provide four contact corners 56 extending along the length of the contact portion for forming electrical connections with plating in circuit board holes in the manner described in connection with electrical connector 10.

FIG. 8 is a cross sectional view taken through the contact portion of a third embodiment compressible core electrical connector 60 which includes six spiral wound strands 62 extending between the ends of the connector. The connector includes tight spiral wound lead-in and trailing portions like the corresponding portions of connector 10. The contact portion includes a cylindrical compressible core 62 which biases the six spiral would strands 62 against plating in circuit board holes. Core 62 may be somewhat more elastically resilient than the triangular and square cores of connectors 10 and 50 where electrical connections are primarily formed at the corners. In connector 60, the core biases the entire lengths of the strands in the holes against the plating.

Figure 9:
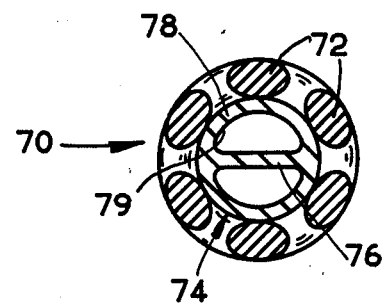

FIG. 9 illustrates a third embodiment compressible electrical core connector 70 similar to the electrical connector 60 of FIG. 8 but with five spiral wound strands 72 extending between the ends of the connector with lead-in and trailing portions and a hollow cylindrical core 74 of uniform cross section having a single diameter web 76 and a continuous cylindrical wall 78. The web and wall define two spaced, cavities 79 each extending the length of the core. This type of core may be formed from a less resilient material than the material forming the solid cylindrical core 64 of connector 60. During insertion and withdrawal of connector 70 the web and wall 76 and 78 deflect and bias all of the strands 72 against the plating in the circuit board hole.

Figure 11:
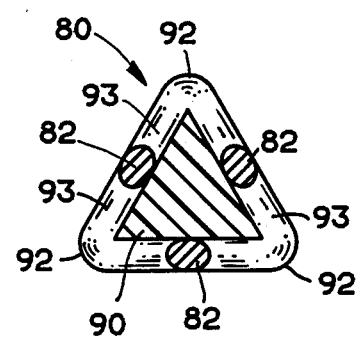
FIG. 11 is a sectional view taken along line 11—11 of FIG. 10.

FIGS. 10 and 11 illustrate a fourth embodiment compressible core electrical connector 80 including spiral wound strands 82 extending between the ends of the connector and tightly spiral wound lead-in and trailing portions 84 and 86 similar to portions 22 and 24, but formed from three strands only. The contact portion 88 includes a solid triangular compressible core 90 like core 18 of connector 10 and three spaced strands 82 spirally wound around the core to provide a plurality of contact corners 92 for forming electrical connections with the plating in a circuit board hole upon insertion of the connector 80 into the hole and deformation of the core 90 as previously described. The strands on the contact portion are spaced apart by spiral windows 93.

Figure 12:
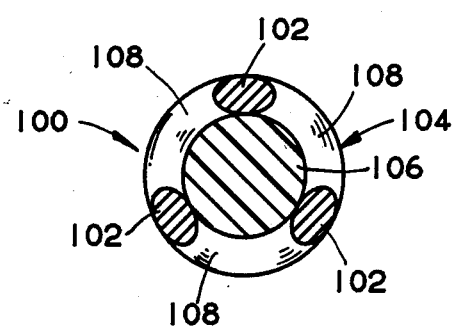
FIG. 12 is a view like FIG. 11 showing a connector with a different type of compressible core.

FIG. 12 is a sectional view taken through another embodiment compressible core electrical connector 100 which is similar to the previously described electrical connector of FIG. 8 but with three spiral wound strands 102 extending between the ends of the connector and tight spiral wound lead in and trailing portions like those of connector 60. The contact portion 104 includes a solid cylindrical compressible plastic core 106 with the three spiral wound strands surrounding the core and spaced apart from each other as shown. The spiral strands in the contact portion 104 of connector 100 are spaced from each other to expose the compressible core at spiral windows 108.

All of the disclosed connectors 10, 50, 60, 70, 80 and 100 are inserted into circuit board holes as described in connection with connector 10 and shown generally in FIG. 4 and may be easily removed from the circuit board holes without injury to the holes or deformation to the plating in the holes. The cores used in these connecors may be made of nylon plastic or other suitable material. All of the connectors include a tapered smooth transition portion at the end of the lead-in portion gradually increasing the diameter of the portion to that of the contact portion to facilitate smooth movement of the contact portion into the holes and compression of the cores. The cores in the contact portions expand immediately to either side of the circuit board holes to form bulges in all of the connectors like bulges 40 shown in FIG. 5. When compressed the cores expand into the window areas to provide pressure relief against excess radial pressure which could injure plating in the holes if the wires at the contact portions were tightly wound against each other.

The compressible core electrical connectors are preferably formed by a continuous length wire winding operation during which the strands are spiral wound and the compressible cores are automatically inserted between the strands at regular intervals along the length of the resultant chain with the trailing end 16 of one connector joining the insertion end to the next connector chain. The chain is of relatively small diameter and flexible to facilitate ready winding on a reel for shipment prior to insertion into the circuit boards at an assembly facility. Insertion may be automated by the use of equipment which feeds the strands from the reel, senses the appropriate location for severing the strands from the chain with appropriate length leadin and trailing portions. The individual severed connectors, as illustrated, may be inserted into the circuit boards manually or by use of automated equipment as desired.

While I have illustrated and described preferred embodiments of my invention, it is understood that these are capable of modification, and I therefore do not wish to be limited to the precise details set forth, but desire to avail myself of such changes and alterations as fall within the purview of the following claims.

What I claim as my invention is:

1. An elongate compressible core electrical connector including:
   (A) a plurality of conductive spiral strands each being wound in the same direction and extending along the length of the connector; and
   (B) an elongate resilient core including a corner, said core being confined within the spiral strands with at least one strand bent around the corner to form a contact and defining a contact portion extending a distance along the length of the connector;
   (C) the strands at one end of the contact portion extending beyond the contact portion a distance approximately equal to the length of the contact portion and being spiral wound together to define an elongate lead-in portion having a transverse cross-sectional smaller than the transverse cross-section of the contact portion;
   (D) whereby the lead-in portion of the connector may be freely piloted into a circuit board hole having an area greater than the transverse cross-section of the lead-in portion of the connector and less than the transverse cross-section of the contact portion and then pulled through the hole to move the contact portion into the hole, compress the core and bias the contact against the hole to form an electrical connection between the strand and the surface of the circuit board hole.

2. A connector as in claim 1 where the core is generally cylindrical.

3. A connector as in claim 1 wherein the corner extends along the core and the strands are wrapped around the corner to define a plurality of corner contacts spaced along the contact portion.

4. A chain of indefinite length including a plurality of connectors as in claim 3, said connectors joined end to end along the length of the chain with each strand in each connector forming part of continuous conductive spiral strand extending along the length of the entire chain and forming a part of each connector in the chain, said contact portions and lead-in portions being regularly spaced along the chain.

5. A connector as in claim 3 wherein the strands include a trailing portion on the other end of the contact portion.

6. A connector as in claim 5 wherein the strands in the trailing portion are spiral wound.

7. A connector as in claim 3 wherein the core is polygonal in cross-section and includes at least three longitudinal corners, the contact portion including at least three pluralities of corner contacts.

8. A connector as in claim 7 wherein the core is triangular in cross-section.

9. A connector as in claims 1, 6 or 7 wherein the strands in the lead-in portion surround a longitudinally extending central opening.

10. A connector as in claims 1, 6, 3 or 7 including six metal strands.

11. A connector as in claims 1, 6, 3 or 7 wherein the lead-in portion includes a tapered transition portion adjacent the contact portion to facilitate movement of the contact portion into a circuit board hole.

12. A connector as in claims 1, 6, 3 or 7 wherein the strands at the contact portion are separated from each other to define spiral window openings extending around the core.

13. A connector as in claim 12 wherein the strands at the lead-in portion extend across the axis of the connector at about 45 degrees and the strands at the contact portion extend across the axis of the connector at an angle greater than 45 degrees.

14. An elongate compressible core electrical connector including:
(A) a plurality of conductive spiral strands each being wound in the same direction and extending along the length of the connector; and
(B) a resilient hollow core confined within the spiral strands and defining a contact portion extending a distance along the length of the connector;
(C) the strands at one end of the contact portion extending beyond the contact portion a distance approximately equal to the length of the contact portion and being spiral wound together to define an elongate lead-in portion having a transverse cross section smaller than the transverse cross section of the contact portion;
(D) whereby the lead-in portion of the connector may be freely piloted into a circuit board hole having an area greater than the transverse cross-section of the lead-in portion of the connector and less than the transverse cross-section of the contact portion and then pulled through the hole to move the contact portion into the hole, compress the core and biases the surrounding strands outwardly against the hole to form electrical connections between the strands and the surface of the circuit board hole.

15. A connector as in claim 14 wherein the core includes a pair of interior openings and a compressible web separating the openings.

16. An elongate compressible core electrical connector including:

(A) a plurality of spiral metal strands each being wound in the same direction and extending along the length of the connector;
(B) an elongate resilient core having a corner extending along the core, the core being confined within the spiral strands and defining a contact portion extending a distance along the length of the connector, said strands being bent around the corner to form a plurality of contacts;
(C) the strands at one end of the contact portion extending beyond the contact portion a distance approximately equal to the length of the contact portion and being spiral wound together to define an elongate lead-in portion having a transverse cross-section smaller than the transverse cross-section of the contact portion;
(D) the strands at the other end of the contact portion extending beyond the contact portion and being spiral wound together;
(E) the lead-in portion including a tapered transition portion adjacent the contact portion to facilitate movement of the contact portion into a circuit board; and
(F) whereby the lead-in portion of the connector may be freely piloted into a circuit board hole having an area greater than the transverse cross-section of the lead-in portion of the connector and less than the transverse cross-section of the contact portion and then pulled through the hole to move the contact portion into the hole, compress the core and bias a number of contacts outwardly against the hole to form electrical connections with the surface of the circuit board hole.

17. A connector as in claim 16 wherein the core is generally cylindrical.

18. A connector as in claim 16 wherein the core is polygonal in cross-section and includes at least three longitudinally extending corners, said strands being bent around the corners to define a number of corner contacts on the outside of each corner extending along the length of the contact portion.

19. A connector as in claim 18 wherein the core is triangular in cross-section.

20. A connector as in claim 16 or 18 wherein the strands to either end of the contact portion surround a central opening.

21. A connector as in claim 16 or 18 wherein the strands at the contact portion are separated from each other to define spiral window openings extending around the core.

22. A chain of indefinite length including a plurality of connectors as in claim 16 or 18, said connectors arranged end to end along the length of the chain with each strand in each connector forming part of a continuous metal spiral strand extending along the length of the entire chain and forming a part of each connector in the chain, said contact portions and lead-in portions being regularly spaced along the chain.

23. An elongate connector for forming an electrical connection between circuit board holes in two adjacent circuit boards, the connector including a contact portion having a compressible core with a corner and a conductor on the outside of the core extending along the length of the core and bent around the corner to form a contact; and a lead-in portion extending from one end of the contact portion at least approximately equal to the length of the contact portion and having a cross-section less than the cross-section of the contact portion.

24. A connector as in claim 23 wherein said lead-in portion forms an extension of said conductor.

25. A connector as in claim 23 wherein the conductor surrounds the core.

26. A connector as in claim 25 wherein said conductor comprises a metal strand, said strand being sprial wound around the core.

27. A connector as in claim 26 wherein said lead-in portion comprises a length of said strand.

28. A connector as in claim 26 wherein said core is formed from a resilient plastic material and has a polygonal cross-section defining a plurality of corners, said strand being repetitively bent around the corners to form a plurality of contacts.

* * * * *